(12) United States Patent
Prabhakar

(10) Patent No.: US 7,835,179 B1
(45) Date of Patent: Nov. 16, 2010

(54) NON-VOLATILE LATCH WITH LOW VOLTAGE OPERATION

(76) Inventor: Venkatraman Prabhakar, 3720 Appian St., Pleasanton, CA (US) 94588

( * ) Notice: Subject to any disclaimer, the term of this patent is extended or adjusted under 35 U.S.C. 154(b) by 222 days.

(21) Appl. No.: 12/009,710

(22) Filed: Jan. 22, 2008

Related U.S. Application Data

(60) Provisional application No. 60/994,499, filed on Sep. 20, 2007.

(51) Int. Cl.
*G11C 11/34* (2006.01)
(52) U.S. Cl. .............................. 365/185.05; 365/185.24
(58) Field of Classification Search ............ 365/185.05, 365/185.24
See application file for complete search history.

(56) References Cited

U.S. PATENT DOCUMENTS

| | | | | |
|---|---|---|---|---|
| 5,587,603 A | | 12/1996 | Kowshik | |
| 5,656,837 A | * | 8/1997 | Lancaster et al. | ............ 257/314 |
| 5,789,776 A | * | 8/1998 | Lancaster et al. | ............ 257/296 |
| 6,002,610 A | * | 12/1999 | Cong et al. | ............ 365/185.05 |
| 6,144,580 A | | 11/2000 | Murray | |
| 6,639,840 B1 | | 10/2003 | Rapp et al. | |
| 6,674,665 B1 | * | 1/2004 | Mann et al. | ............ 365/185.08 |
| 7,280,421 B2 | | 10/2007 | Young et al. | |
| 2003/0161192 A1 | * | 8/2003 | Kobayashi et al. | ........... 365/200 |
| 2004/0264271 A1 | * | 12/2004 | Tanzawa et al. | ............. 365/201 |

* cited by examiner

*Primary Examiner*—Michael T Tran
(74) *Attorney, Agent, or Firm*—Michael C. Stephens, Jr.

(57) ABSTRACT

Methods, circuits, devices, and/or arrangements for providing a non-volatile latch are disclosed. In one embodiment, a non-volatile latch can include: (i) a first non-volatile memory (NVM) cell coupled to a first supply, a first gate (e.g., a control gate), and an output node, where the first NVM cell is configured to be in a first state; and (ii) a second NVM cell coupled to a second supply, a second gate (e.g., another control gate), and the output node, where the second NVM cell is configured to be in a second state.

40 Claims, 6 Drawing Sheets

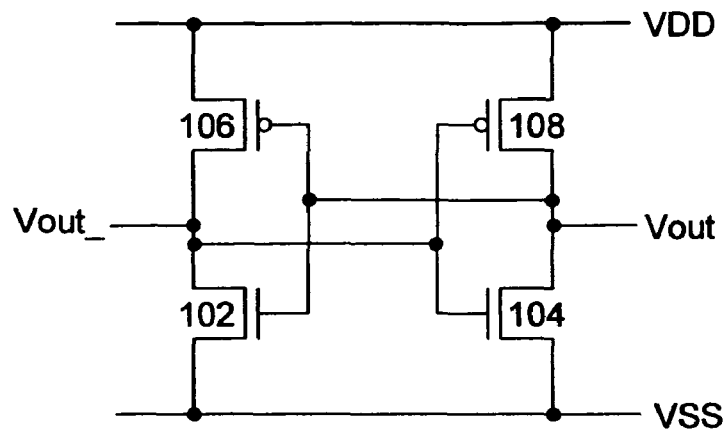
FIG. 1 (conventional)
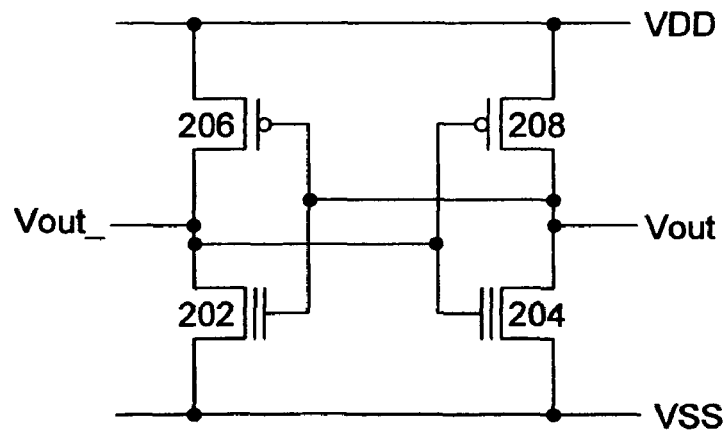
FIG. 2 (conventional)

NON-VOLATILE LATCH WITH LOW VOLTAGE OPERATION

RELATED APPLICATIONS

This application claims the benefit of U.S. Provisional Application No. 60/994,499, filed on Sep. 20, 2007, incorporated herein by reference in its entirety.

FIELD OF THE INVENTION

The present invention generally relates to the field of semiconductor memories. More specifically, embodiments of the present invention pertain to methods, circuits, devices, and/or arrangements for providing a non-volatile latch.

DISCUSSION OF THE BACKGROUND

Non-volatile memory (NVM), such as electrically erasable programmable read-only memory (EEPROM), flash, etc., are in widespread use in the industry today. Such devices are used in compact flash cards for digital cameras, memory sticks, jump drives, EEPROM chips for booting-up devices (e.g., basic input/output system (BIOS)), and many other applications. Such devices in mass production generally have cells formed by two polysilicon ("poly") layers, where a first poly layer is used as a floating gate (FG), and a second poly layer is used as a control gate (CG). The control gate may be capacitively coupled to the floating gate using an oxide-nitride-oxide (ONO) layer, which is deposited between the two poly layers. Another type of NVM cell includes a charge storage layer (e.g., a nitride) that is sandwiched between two oxide layers under a poly gate.

Non-volatile cells and latches can be used to store information even when integrated circuit (IC) ("chip") power is off. In some applications, a non-volatile latch may be a better choice than a single NVM cell because of additional margin in maintaining a stored state. For example, non-volatile latches are used in applications, such as in configuration bits for device configuration state, encryption bits for security, and in any other suitably critical application. The latches may generally be programmed either at a semiconductor device manufacturing site, or in the field.

Many conventional latches are based on a static random-access memory (SRAM) type structure. FIG. 1 shows a conventional back-to-back inverter structure 100 found in an SRAM-type latch. VDD is a power supply coupled to PMOS transistors 106 and 108, while VSS is a ground supply coupled to NMOS transistors 102 and 104. Latch output voltages are indicated as Vout (true) and Vout_(complement) at respective output nodes.

FIG. 2 shows a conventional non-volatile latch structure 200. In this latch, PMOS devices 206 and 208 may be the same or similar to those of the SRAM latch of FIG. 1. However, one or more transistors in this general SRAM structure can be replaced with NVM cells. Here, two N-type NVM cells (e.g., 202 and 204) can be substituted for standard NMOS transistors in order to make the latch non-volatile, such that data can be retained even when chip power is turned off. In other conventional approaches, one of the NMOS transistors may be replaced by an NVM cell, while the other latch leg utilizes an NMOS transistor or a resistor.

SUMMARY OF THE INVENTION

Embodiments of the present invention relate to methods, circuits, devices, and/or arrangements for providing a non-volatile latch.

In one embodiment, a non-volatile latch can include: (i) a first non-volatile memory (NVM) cell coupled to a first supply, a first gate (e.g., a control gate), and an output node, where the first NVM cell is configured to be in a first state; and (ii) a second NVM cell coupled to a second supply, a second gate (e.g., another control gate), and the output node, where the second NVM cell is configured to be in a second state.

In another embodiment, a method of operating a non-volatile latch can include the steps of: (i) receiving an indication (e.g., a command) for accessing the non-volatile latch, where the non-volatile latch includes a first NVM cell coupled in series with a second NVM cell, and where the first and second NVM cells are independently controllable using separate control gates; (ii) when the indication is a latch state set indication or command, programming the first NVM cell and erasing the second NVM cell; (iii) when the indication is a latch state reset indication, erasing the first NVM cell and programming the second NVM cell; and (iv) when the indication is a latch state read indication, biasing each of the control gates to read the latch state on an output node. Other example methods of operating include non-selective operations (e.g., programming or erasing each NVM cell in the latch) followed by selective operations (e.g., erasing or programming one of the NVM cells in the latch).

In another embodiment, an electrically erasable programmable read-only memory (EEPROM) device can include: (i) a controller configured to control programming, erasing, and reading of a memory portion; and (ii) the memory portion having non-volatile latches, where each of the non-volatile latches can include: (a) a first NVM cell coupled to a first supply, a first gate, and an output node, where the first NVM cell is configured to be in a first state; and (b) a second NVM cell coupled to a second supply, a second gate, and the output node, where the second NVM cell is configured to be in a second state. The memory portion may also contain a plurality of NVM cells and/or SRAM cells in addition to the non-volatile latches.

Embodiments of the present invention can advantageously provide a non-volatile latch operable at relatively low voltages. Further, embodiments of the present invention can reduce latch area as compared to conventional approaches, thus resulting in lower chip costs. These and other advantages of the present invention will become readily apparent from the detailed description of preferred embodiments below.

BRIEF DESCRIPTION OF THE DRAWINGS

FIG. 1 is a schematic diagram of a conventional SRAM latch.

FIG. 2 is a schematic diagram of a conventional non-volatile latch.

DETAILED DESCRIPTION OF THE PREFERRED EMBODIMENTS

Figure 3:
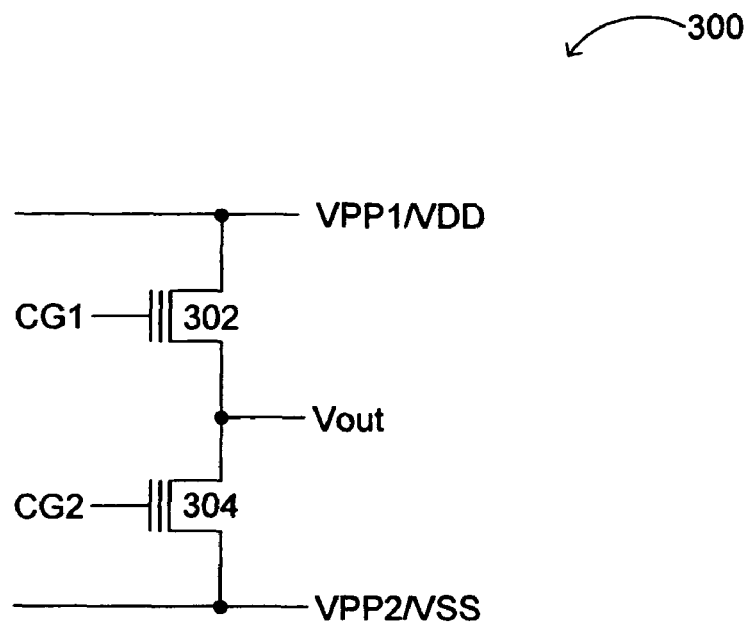
FIG. 3 is a schematic diagram of an example non-volatile latch in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, schematic symbols, and other symbolic representations of operations on code, data bits, data streams, signals, or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

A non-volatile latch is disclosed herein, where the latch employs two non-volatile memory (NVM) cells. For example, the NVM cells can be "N-type" (i.e., including N-type diffusion regions in a PWELL or P-type substrate). Such a latch in particular embodiments may provide an output node that can be programmed to be "high" (e.g., a voltage level detected as a logic '1' level) or "low" (e.g., a voltage level detected as a logic '0' level). This output voltage (and the complement thereof) can be used to control various circuit elements, such as a pass-gate, an inverter, a CMOS transmission gate, or any suitable digital or analog logic circuitry, to name just a few examples.

N-type NVM cells or elements in certain embodiments may be of the floating gate type (e.g., using separate polysilicon portions, either in the same or different layers, to implement control and floating gates) or charge trapping layer type (e.g., using an oxide-nitride-oxide (ONO) structure for charge storage instead of a floating gate). Other possible charge trapping layer types suitable for use in particular embodiments include high-k dielectrics, a combination of oxide and high-k dielectrics, and nanocrystals. In addition, programming of a non-volatile latch in particular embodiments can involve, e.g., one N-type NVM cell being set in an "ON" state, while the other N-type NVM cell is set in an "OFF" state.

The invention further relates to hardware implementations of the present arrangement, method and circuit. Embodiments of the present invention can advantageously provide a non-volatile latch operable at relatively low voltages. Further, embodiments of the present invention reduce latch area as compared to conventional approaches, thus resulting in lower chip costs. The invention, in its various aspects, will be explained in greater detail below with regard to exemplary embodiments.

Exemplary Non-Volatile Latch Structure/Circuits

In one example, a non-volatile latch includes: (i) a first non-volatile memory (NVM) cell coupled to a first supply, a first gate (e.g., a control gate), and an output node, where the first NVM cell is configured to be in a first state; and (ii) a second NVM cell coupled to a second supply, a second gate, and the output node, where the second NVM cell is configured to be in a second state.

Referring now to FIG. 3, a schematic diagram of an example non-volatile latch 300 in accordance with embodiments of the present invention is shown. NVM cells (e.g., N-type NVM cells) may be of the floating gate type or the charge trapping type. In this example, N-type NVM cells 302 and 304 can connect essentially in a series configuration to form the latch structure. Further, supplies can be variable and controllable such that different supply levels can be provided to latch structure 300, depending on the particular mode of operation (e.g., cell program, erase, read, etc.). For example, supply VPP1/VDD is VPP1 during program and erase modes, and VDD during read mode. Similarly, supply VPP2/VSS can be VPP2 during program and erase modes, and VSS or ground level during the read mode. Also, separate (e.g., independently controlled) control gate signals CG1 for NVM cell 302 and CG2 for NVM cell 304 can be employed. A latch output voltage (Vout) can also be provided at a common node between NVM cells 302 and 304.

In certain embodiments, programming (turning an NVM cell OFF) can be performed using channel hot electron (CHE) injection in order to force electrons into the charge storage layer (e.g., polysilicon, nitride, oxynitride, etc.). In certain embodiments, erasing (turning an NVM cell ON) can be performed using channel-induced hot holes (CHH) injected into the charge storage layer to pair with electrons in at least partially negating any stored charge. Other methods, such as Fowler-Nordheim (F-N) tunneling, may alternatively be used to program/erase NVM cells 302 and/or 304.

Generally, the non-volatile latch programming in particular embodiments can result in one of two states at the latch output: Vout=VDD (high), or Vout=VSS (low). To set the latch in the high state (Vout=VDD), NVM device 302 can be erased to be ON, and NVM device 304 may be programmed to be OFF. To set the latch in the low state (Vout=VSS), NVM device 302 may be programmed to be OFF, and NVM device 304 can be erased to be ON.

Other state combinations can also be accommodated in particular embodiments. For example, the latch may be set in a high impedance state or a high current state by having NVM devices 302 and 304 both programmed to be OFF, or both erased to be ON, respectively. In this fashion, voltage or current-based control of various circuit elements can utilize a latch in particular embodiments. For example, current-based control may be achieved by including another transistor (e.g., an NMOS transistor), resistor, or other current sensing and/or mirroring circuitry in series with NVM devices 302 and 304 in order to allow for current-based control. In addition, the state when both NVM devices 302 and 304 are erased to be ON can be used to generate an intermediate value of Vout (e.g., when NVM devices 302 and 304 are ON with different currents or resistances, Vout may be neither VDD or VSS, but rather somewhere in between). This intermediate value of Vout may be used to control analog and/or digital circuits that are optimized for such intermediate voltage levels.

In any event, non-volatile latches in particular embodiments save chip area as compared to conventional approaches by reducing a number of transistors (e.g., by removing any PMOS transistors, such as 206 and 208 of FIG. 2), while maintaining correct latch operation. Further, by not including PMOS-type transistors in latch structures of particular embodiments, latch area can be reduced due to reduced spacing rules between NMOS transistors versus the spacing requirements between NMOS and PMOS transistors (e.g., including NWELL rules, etc.).

However, some embodiments can include protection transistors, such as a PMOS transistor connected in series between supply VPP1/VDD and NVM cell 302 (e.g., a source to VPP1/VDD and a drain to NVM cell 302), and/or an NMOS transistor connected in series between supply VPP2/VSS and NVM cell 304 (e.g., a source to VPP2/VSS and a drain to NVM cell 304). Such protection transistors can be used to prevent a corresponding non-volatile latch from changing state (e.g., when the PMOS protection transistor gate is high to disable a path to supply VPP1/VDD, or the NMOS protection transistor gate is low to disable a path to supply VPP2/VSS). For example, certain key configuration bits could be made with this structure such that the NVM cells/latches protected in this fashion are not disturbed during programming in the field, but are rather restricted to such programming at the factory to store a given configuration.

Figure 4A:
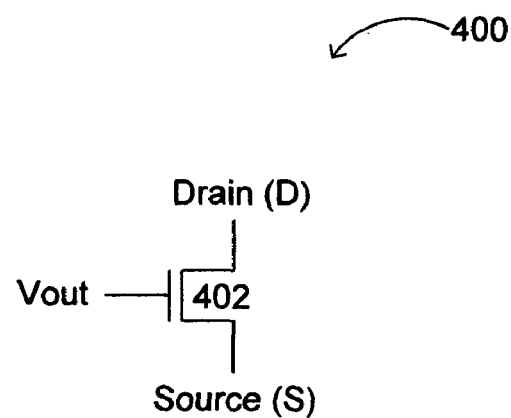
FIG. 4A is a schematic diagram of an example NMOS pass-gate suitable for use in accordance with embodiments of the present invention.
Figure 4B:
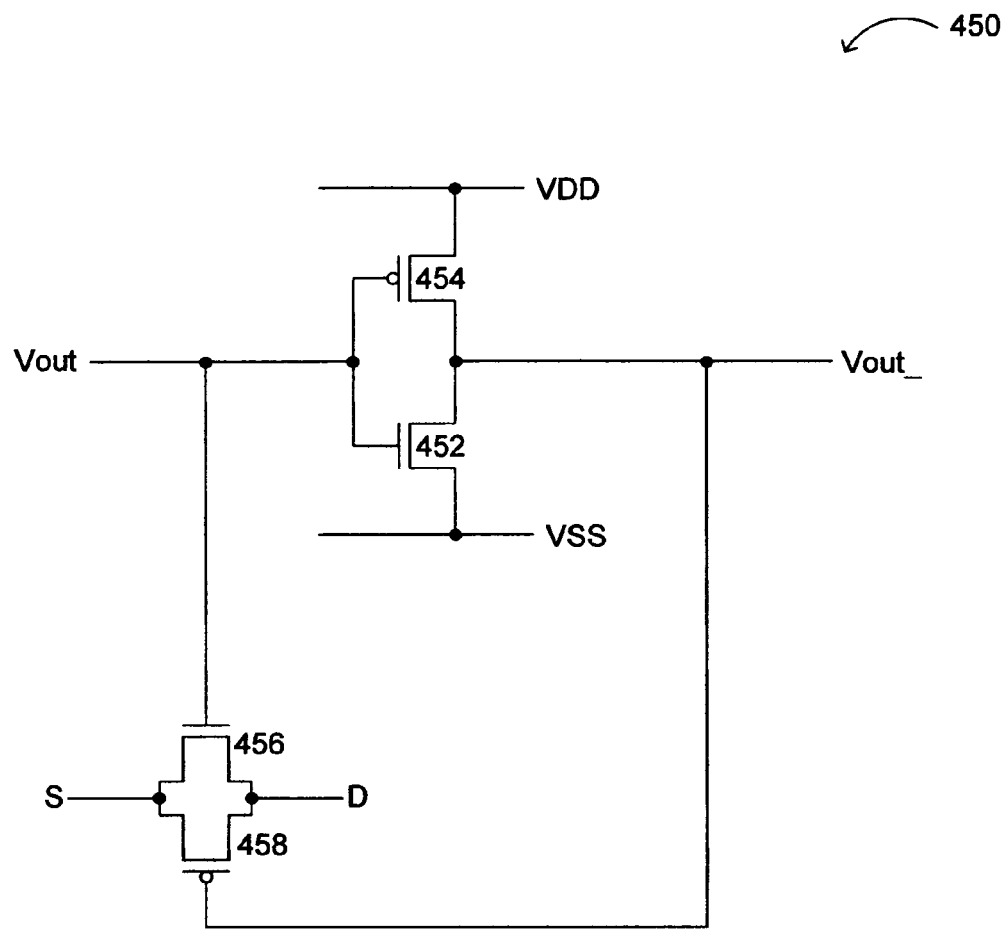
FIG. 4B is a schematic diagram of an example CMOS transmission gate with inverter suitable for use in accordance with embodiments of the present invention.

Latch output node voltage (Vout) can be used to control various circuit elements (e.g., logic gates, such as NAND gates, NOR gates, XNOR gates, inverters, flip-flops, etc., transistors, capacitors, resistors, other types of logic, such as dynamically-precharged logic, as well as other memory elements, such as SRAM elements, etc.). FIGS. 4A and 4B show particular NMOS pass-gate and CMOS transmission gate examples.

Referring now to FIG. 4A, a schematic diagram of an example NMOS pass-gate 400 suitable for use in accordance with embodiments of the present invention is shown. In this particular example, Vout is used to drive NMOS pass-gate 402. Pass-gate 402 can make a connection between the drain (D) and source (S) nodes when Vout is high, while D and S can remain disconnected when Vout is low. Full CMOS pass-gates or transmission gates can, however, provide improved such connectivity.

Referring now to FIG. 4B, a schematic diagram of an example CMOS transmission gate with inverter 450 suitable for use in accordance with embodiments of the present invention is shown. An inverter is made up of NMOS transistor 452 and PMOS transistor 454, with VDD being the power supply, and VSS being the ground supply for the inverter. In this particular example, Vout is used to drive the inverter to generate Vout_, the complement of Vout. Both Vout and Vout_ can be used to control a CMOS transmission gate 456/458. Thus, nodes D and S are connected when Vout is high, and disconnected when Vout is low.

Exemplary Non-Volatile Latch Operation

Voltage may be applied to the control gate, the source, and the drain of each NVM cell in the non-volatile latch in order to perform latch state setting (e.g., programming, erasing), as well as reading of the latch state. Programming and erasing can be done using combinations of Fowler-Nordheim (F-N) tunneling, channel hot electron (CHE) injection, and/or channel-induced hot holes (CHH) methods.

In one example, a method of operating a non-volatile latch can include the steps of: (i) receiving an indication (e.g., a command) for accessing the non-volatile latch, where the non-volatile latch includes a first NVM cell coupled in series with a second NVM cell, and where the first and second NVM cells are independently controllable using separate gates; (ii) when the indication is a latch state set command, programming the first NVM cell and erasing the second NVM cell; (iii) when the indication is a latch state reset command, erasing the first NVM cell and programming the second NVM cell; and (iv) when the indication is a latch state read command, biasing each of the gates (e.g., to a high level) to read the latch state on an output node. Other example methods of operating include non-selective operations (e.g., programming or erasing each NVM cell in the latch) followed by selective operations (e.g., erasing or programming one of the NVM cells in the latch).

Figure 5A:
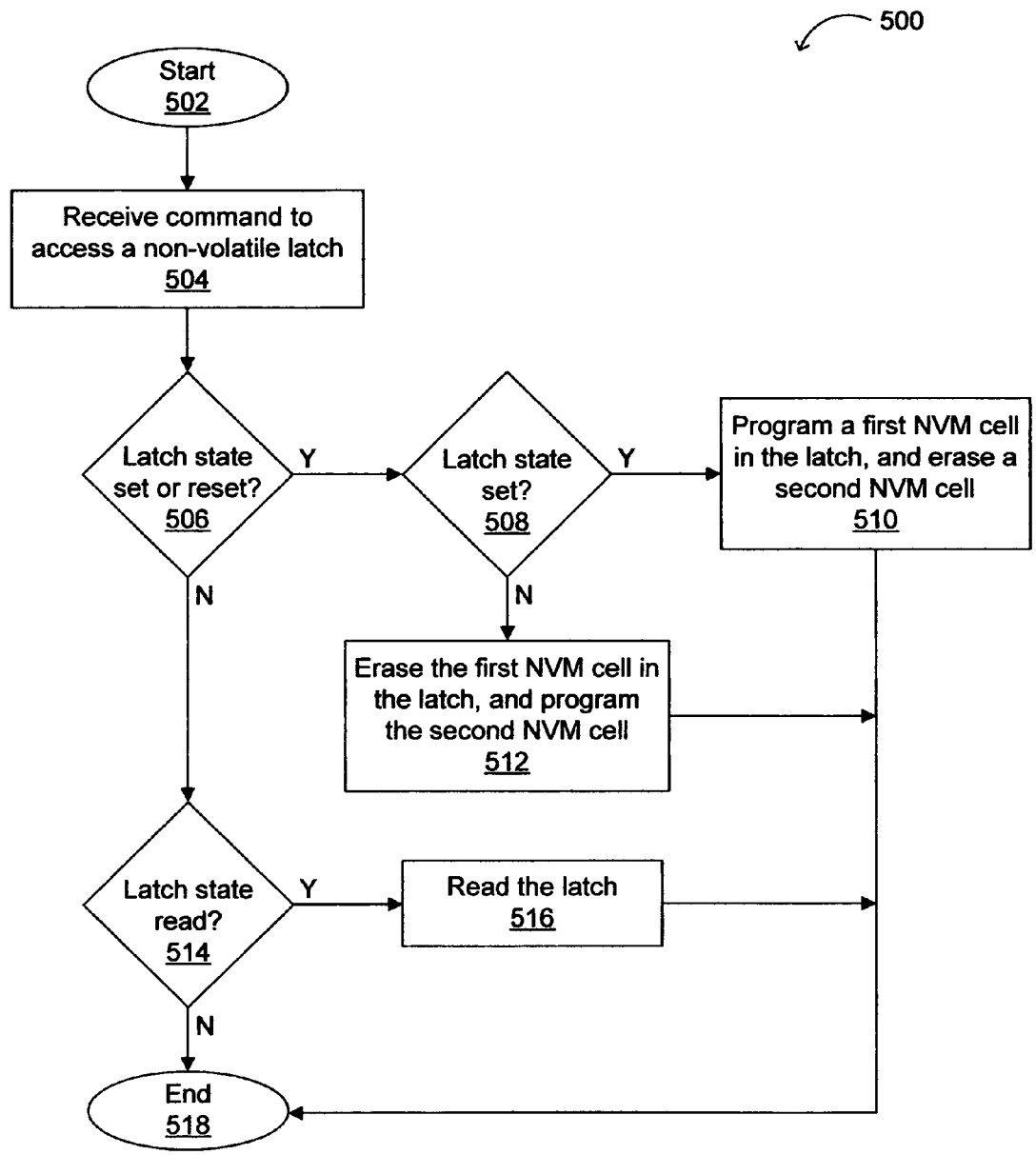
FIG. 5A is a flow diagram of a first example method of operating a non-volatile latch in accordance with embodiments of the present invention.

Referring now to FIG. 5A, a flow diagram of an example method of operating a non-volatile latch 500 in accordance with embodiments of the present invention is shown. The flow can begin (502), and a command to access the non-volatile latch can be received (504). If the command is a latch state set or reset command (506), and a latch state is to be set (e.g., Vout=low) (508), a first NVM cell (e.g., NVM cell 302) in the non-volatile latch can be programmed for turning OFF, and a second NVM cell (e.g., NVM cell 304) in the non-volatile latch can be erased for turning ON (510). Similarly, if the command is a latch state set or reset command (506), and a latch state is to be reset (e.g., Vout=high) (508), a first NVM cell (e.g., NVM cell 302) in the non-volatile latch can be erased for turning ON, while a second NVM cell (e.g., NVM cell 304) in the non-volatile latch can be programmed for turning OFF (512). Other NVM cell ON/OFF combinations (e.g., both NVM cells being ON, or both NVM cells being OFF) can also be supported in order to accommodate current-based or other suitable control from the latch state. Further, when the command is not a latch state set/reset command (506), but rather a latch state read command (514), a state of the latch can be read (516), completing the flow (518).

Figure 5B:
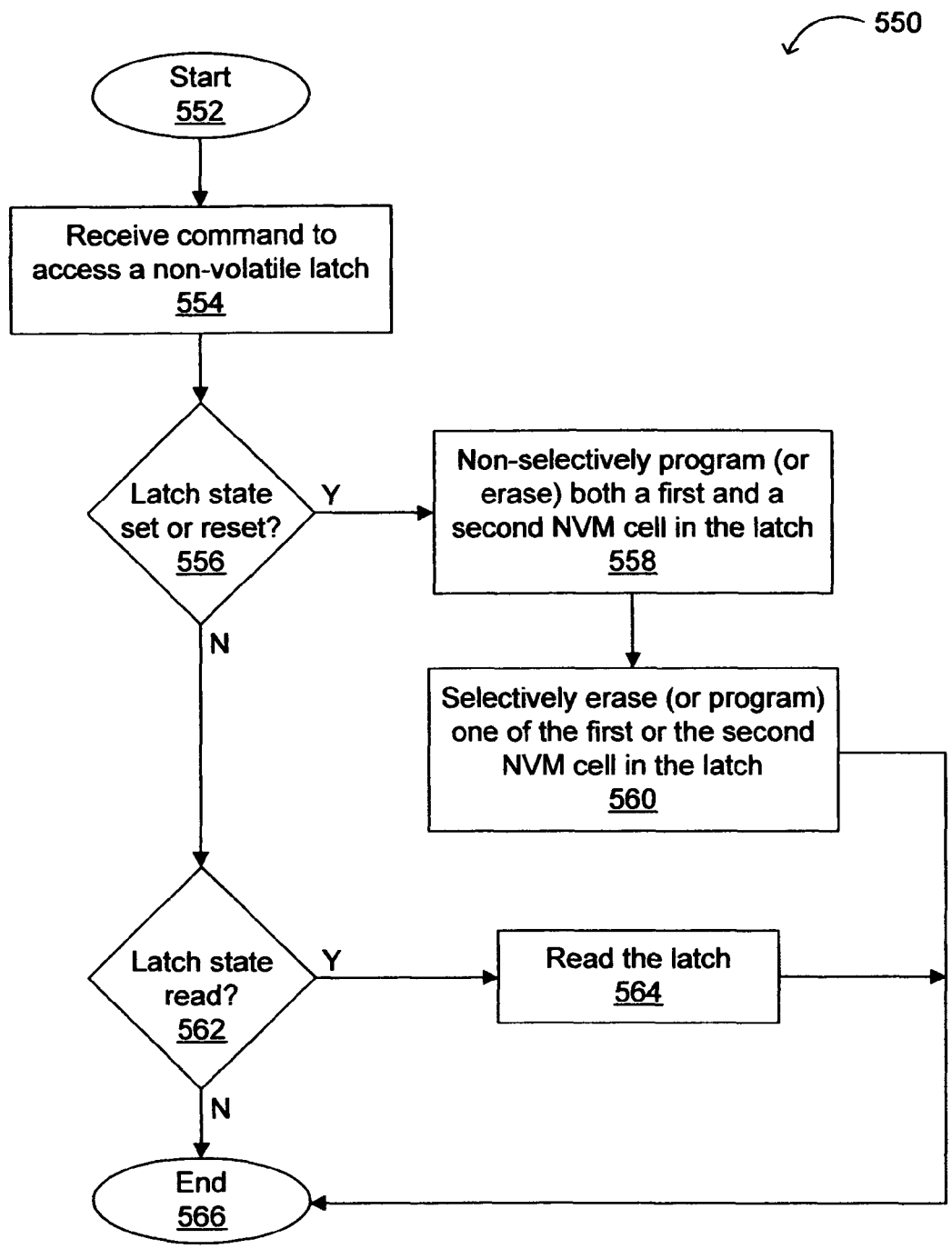
FIG. 5B is a flow diagram of a second example method of operating a non-volatile latch in accordance with embodiments of the present invention.

Referring now to FIG. 5B, shown is a flow diagram of a second example method of operating a non-volatile latch 550 in accordance with embodiments of the present invention. In this example, one operation (e.g., programming using F-N) may be non-selective, while another operation (e.g., erasing via CHH) is selective. The flow can begin (552), and a command to access the non-volatile latch can be received (554). If the command is a latch state set or reset command (556), a non-selective operation (e.g., programming or erasing) can be performed on both a first NVM cell (e.g., NVM cell 302) and a second NVM cell (e.g., NVM cell 304) in the non-volatile latch (558). Then, a selective operation (e.g., erasing or programming) can be performed on one of the first or the second NVM cells in the non-volatile latch (560). Further, when the command is not a latch state set/reset command (556), but rather a latch state read command (562), a state of the latch can be read (564), completing the flow (566).

As an example of such a non-selective operation followed by a selective operation, a latch state set operation can include programming both NVM cells (e.g., 302 and 304), followed by an erase of, e.g., NVM cell 304. Similarly, a latch state reset operation can include programming both NVM cells (e.g., 302 and 304), followed by an erase of, e.g., NVM cell 302. Further, in some applications (e.g., a programmable logic device (PLD), a field-programmable gate array (FPGA), etc.), a chip containing non-volatile latches as described herein may operate such that chip power-up/on detection, or another appropriate indication or command, is sufficient control to read the latches. In such cases, there may not be a special read command, or a need for a special command to be received after power-up.

Tables 1-5 below show particular example supply and control signal values in order to set/reset certain latch states, or to the read the state of the non-volatile latch, as described above. For example, setting a latch state (508) can include asserting supplies and control signals as shown below in Tables 1 and 4 (510). Similarly, resetting a value latch state (508) can include asserting supplies and control signals as shown below in Tables 2 and 3 (512). Also, reading a latch state can include asserting supplies and control signals as shown below in Table 5 (516).

Example details of operation of non-volatile latches are described below with reference to FIG. 3. In certain embodiments, NVM cells 302 and 304 can be programmed using CHE, and erased using CHH. Further, supply VPP1/VDD can be controlled as VPP1 during program and erase modes, and VDD during read mode. Similarly, supply VPP2/VSS can be controlled as VPP2 during program and erase modes, and VSS or ground level during the read mode.

Example voltages for programming NVM cell 302 (to turn NVM cell 302 OFF) are shown below in Table 1. These example voltages can be applied to place the NVM cell in a CHE injection region for programming, and any suitable voltages can be utilized in particular embodiments. For example, programming voltages can include a control gate voltage (e.g., at CG1) range of from about 4 V to about 8 V, a drain voltage (e.g., VPP1) range of from about 4 V to about 7 V, and a source voltage (e.g., Vout) range of from about −0.5 V to about +0.5 V.

TABLE 1

(Turning NVM cell 302 OFF):

| Operation | Program (CHE) |
|---|---|
| VPP1 | 5 V |
| Vout | 0 V |
| CG1 | 5.5 V |
| CG2 | 0 V |
| VPP2 | 0 V |

Example voltages for erasing NVM cell 302 (to turn NVM cell 302 ON) are shown below in Table 2. These example voltages can be applied to place the NVM cell in a CHH injection region for erasing, and any suitable voltages can be utilized in particular embodiments. For example, erasing voltages can include a control gate voltage (e.g., at CG1) range of from about +5 V to about −1 V, a drain voltage (e.g., VPP1) range of from about 4 V to about 7 V, and a source voltage (e.g., Vout) range of from about −0.5 V to about +0.5 V. Further, erasing using CHH in particular embodiments can employ a voltage ramping (e.g., a ramp down using a staircase or other suitable function) on the appropriate control gate for improved performance.

TABLE 2

(Turning NVM cell 302 ON):

| Operation | Erase (CHH) |
|---|---|
| VPP1 | 5 V |
| Vout | 0 V |
| CG1 | 2 V fixed, or ramp down from 4 V to 0 V |
| CG2 | 0 V |
| VPP2 | 0 V |

Example voltages for programming NVM cell 304 (to turn NVM cell 304 OFF) are shown below in Table 3. These example voltages can be applied to place the NVM cell in a CHE injection region for programming, and any suitable voltages can be utilized in particular embodiments. For example, programming voltages can include a control gate voltage (e.g., at CG2) range of from about 4 V to about 8 V, a drain voltage (e.g., VPP2) range of from about 4 V to about 7 V, and a source voltage (e.g., Vout) range of from about −0.5 V to about +0.5 V.

TABLE 3

(Turning NVM cell 304 OFF):

| Operation | Program (CHE) |
|---|---|
| VPP1 | 0 V |
| Vout | 0 V |
| CG1 | 0 V |
| CG2 | 5.5 V |
| VPP2 | 5 V |

Example voltages for erasing NVM cell 304 (to turn NVM cell 304 ON) are shown below in Table 4. These example voltages can be applied to place the NVM cell in a CHH injection region for erasing, and any suitable voltages can be utilized in particular embodiments. For example, erasing voltages can include a control gate voltage (e.g., at CG2)

range of from about +5 V to about −1 V, a drain voltage (e.g., VPP2) range of from about 4 V to about 7 V, and a source voltage (e.g., Vout) range of from about −0.5 V to about +0.5 V. Further, erasing using CHH in particular embodiments can employ a voltage ramping (e.g., a ramp down using a staircase or other suitable function) on the appropriate control gate for improved performance.

TABLE 4

(Turning NVM cell 304 ON):

| Operation | Erase (CHH) |
|---|---|
| VPP1 | 0 V |
| Vout | 0 V |
| CG1 | 0 V |
| CG2 | 2 V fixed, or ramp down from 4 V to 0 V |
| VPP2 | 5 V |

Example voltages for reading a non-volatile latch in particular embodiments are shown below in Table 5. For example, Vout is high (e.g., about a threshold voltage below VDD, e.g., VDD−$V_t$ of NVM cell 302), or Vout is low (e.g., about 0 V), depending on the states of NVM cells 302 and 304. For a Vout high reading, NVM cell 302 may have been erased to be ON, and NVM cell 304 may have been programmed to be OFF. Conversely, for a Vout low reading, NVM cell 302 may have been programmed to be OFF, and NVM cell 304 may have been erased to be ON. For example, reading voltages can include control gate (e.g., CG1 and CG2) voltage ranges from about 0.5 V to about 3.3 V, a VPP1/VDD range of from about 0.25 V to about 1.5 V, and a VPP2/VSS range of from about 0 V to about +1 V.

TABLE 5

| Operation | Read |
|---|---|
| VPP1/VDD | VDD (about 1 V) |
| VPP2/NSS | VSS (about 0 V) |
| CG1 | VDD |
| CG2 | VDD |

Alternatively, current-based reading of non-volatile latches in certain embodiments (e.g., for NVM cells 302 and 304 having ON/ON or OFF/OFF states) can include current mirroring and/or differential amplification in order to determine a latch state. Further, the operating voltages shown above in Tables 1-5 may vary depending on the technology used, and also due to implant optimization on sources, drains, lightly doped drains (LDD), as well as halo implantations for the channel from the sides of the gate. In certain embodiments, LDD and halo implants may be optimized to achieve sufficient CHE/CHH generation at an NVM cell drain in a range of from about 3 V to about 4.5 V, such as from about 3.5 V to about 4.25 V, and more specifically about 4 V.

In addition, a ramp of a control gate (e.g., at CG1 or CG2) during programming (e.g., CHE injection), such as from about 4 V to about 6 V, can also provide some advantages to cell reliability at the expense of more circuit complexity in achieving this ramp. However, a single programming voltage on a control gate (e.g., at CG1 or CG2) is also suitable for effective operation in certain embodiments. In particular embodiments, the operating voltages shown above in Tables 1-5 can be any suitable values within appropriate ranges for certain technologies and/or design approaches.

Exemplary Non-Volatile Latch Applications

In one example, an electrically erasable programmable read-only memory (EEPROM) device includes: (i) a controller configured to control programming, erasing, and reading of a memory portion; and (ii) the memory portion having a plurality of non-volatile latches, where each non-volatile latch can include: (a) a first NVM cell coupled to a first supply, a first gate (e.g., a control gate), and an output node, where the first NVM cell is configured to be in a first state; and (b) a second NVM cell coupled to a second supply, a second gate, and the output node, where the second NVM cell is configured to be in a second state.

Figure 6:
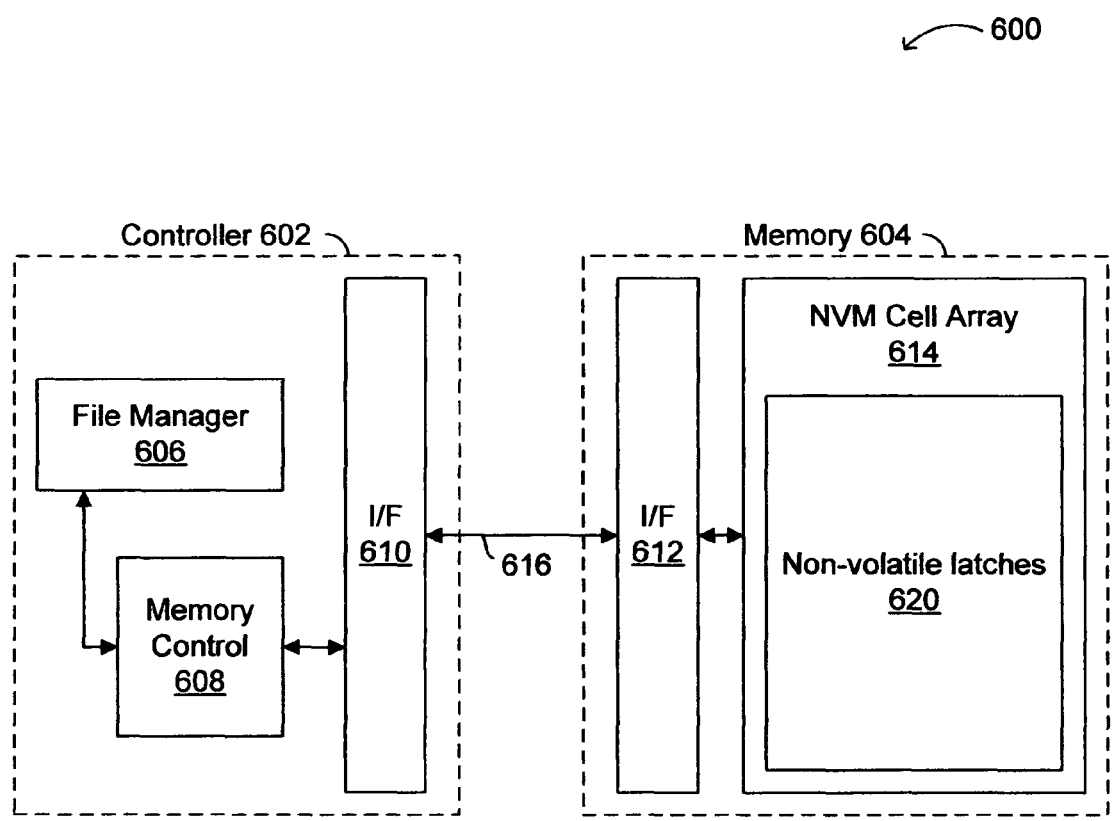
FIG. 6 is a block diagram of an example non-volatile latch application in accordance with embodiments of the present invention.

Referring now to FIG. 6, a block diagram of an example non-volatile latch application 600 in accordance with embodiments of the present invention is shown. Non-volatile latches may be used in a variety of applications, such as in configuration bits for memory or other device configuration states, encryption bits for security, and in any other suitably critical application. Such non-volatile latches can also be used in programmable devices, such as PLDs, complex PLDs (CPLDs), and FPGAs. In addition, non-volatile latches may be used in providing backup storage for other types of memory, such as SRAMs or dynamic RAMs (DRAMs). For example, when power is interrupted, a chip may write data to non-volatile memory (either on chip, or to a separate chip) when it is about to shut down in order to secure the data.

For example, 600 is a memory stick application that incorporates non-volatile memory and a controller. Controller 602 (e.g., a host controller) can include file manager 606, memory control block 608, and interface 610. Memory 604 (e.g., an EEPROM) can include NVM cell array 614 (e.g., in NAND or NOR arrangements of NVM cells), non-volatile latches 620, and interface 612. For example, non-volatile latches 620 include an array of non-volatile latches. Further, in some applications, NVM cell array 614 can alternatively include an array of SRAM cells, and a set of non-volatile latches for SRAM back-up. Interfaces 610 and 612 can communicate over signal 616, which can include serial and/or parallel interface support, to provide clocking, address selection, data interfacing, and command control (e.g., read, program, erase) for NVM cells in array 614, as well as command control (e.g., latch set, latch reset, latch read) for non-volatile latches 620. Other components can include a data buffer, registers, error correction circuitry, and voltage supply circuitry. Further, as discussed above, some applications (e.g., PLD, FPGA, etc.), can utilize power-on detection, or another appropriate indication or command, to initiate non-volatile latch reading.

In this fashion, a non-volatile latch operable at relatively low voltages, and with reduced area consumption as compared to conventional approaches, can be provided. Further, CHE injection may be used in NVM cell programming, while CHH (e.g., with ramping of an associated control gate) can be used in NVM cell erasing. In addition, either a standard 2-poly ONO NVM cell structure, or a single poly NVM cell structure or a charge-trap layer NVM cell structure can be used to construct the NVM cells in non-volatile latches of particular embodiments.

While the above examples include CMOS implementations of non-volatile latches and associated circuitry, one skilled in the art will recognize that other technologies, such as silicon-on-insulator (S01), as well as other target applications, may also be used in accordance with embodiments. For example, SRAM cells may be backed-up by non-volatile latches as described herein, where such SRAM cells can recover their data when power is returned (e.g., using the Vout level, and associated circuitry). Further, one skilled in the art will recognize that other circuit structures and the like may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A non-volatile latch, comprising:
   a) a first non-volatile memory (NVM) cell connected to a first supply, a first gate, and an output node, wherein said first NVM cell is configured to be in a first state; and
   b) a second NVM cell connected to a second supply, a second gate, and said output node, wherein said second NVM cell is configured to be in a second state, wherein said first and second gates are independently controllable.

2. The non-volatile latch of claim 1, wherein said first and second supplies are configured to be variable depending on a mode of operation.

3. The non-volatile latch of claim 1, further comprising a protection transistor coupled in series between said first NVM cell and said first supply.

4. The non-volatile latch of claim 1, further comprising a protection transistor coupled in series between said second NVM cell and said second supply.

5. The non-volatile latch of claim 1, further comprising:
   a) a first protection transistor coupled in series between said first NVM cell and said first supply; and
   b) a second protection transistor coupled in series between said second NVM cell and said second supply.

6. The non-volatile latch of claim 1, wherein said first and second NVM cells each comprise a conductive material charge storage layer.

7. The non-volatile latch of claim 6, wherein said conductive material charge storage layer comprises polysilicon.

8. The non-volatile latch of claim 6, wherein said conductive material charge storage layer comprises metal.

9. The non-volatile latch of claim 1, wherein said first and second NVM cells each comprise a dielectric material charge storage layer.

10. The non-volatile latch of claim 9, wherein said dielectric material charge storage layer comprises a high-k dielectric.

11. The non-volatile latch of claim 9, wherein said dielectric material charge storage layer comprises nitride or oxynitride.

12. The non-volatile latch of claim 1, wherein said first and second NVM cells each comprise a charge storage layer having nanocrystals.

13. The non-volatile latch of claim 1, wherein said first and second NVM cells each are configured to be programmed using channel hot electron (CHE) injection.

14. The non-volatile latch of claim 13, wherein said configured to be programmed comprises said first or said second supply at about 5 V, said output node at about 0 V, and said first or said second gate at about 5.5 V.

15. The non-volatile latch of claim 1, wherein said first and second NVM cells each are configured to be erased using channel-induced hot hole (CHH) injection.

16. The non-volatile latch of claim 15, wherein said configured to be erased comprises said first or said second supply at about 5 V, said output node at about 0 V, and said first or said second gate at about 2 V.

17. The non-volatile latch of claim 15, wherein said configured to be erased further comprises ramping down a voltage on said first or said second gate.

18. The non-volatile latch of claim 17, wherein said ramping down said voltage on said first or said second gate comprises using a staircase function.

19. The non-volatile latch of claim 1, wherein said first state is ON, and said second state is OFF.

20. The non-volatile latch of claim 1, wherein said first state is OFF, and said second state is ON.

21. The non-volatile latch of claim 1, wherein said first and second states are ON.

22. The non-volatile latch of claim 1, wherein said first and second states are OFF.

23. The non-volatile latch of claim 1, wherein said output node is configured to control a transistor.

24. The non-volatile latch of claim 1, wherein said output node is configured to control an inverter, latch, SRAM cell, or combinations thereof.

25. A method of operating a non-volatile latch, comprising the steps of:
   a) receiving an indication for accessing said non-volatile latch, said non-volatile latch including a first non-volatile memory (NVM) cell coupled in series with a second NVM cell, wherein said first and second NVM cells are independently controllable using separate gates;
   b) when said indication is a latch state set indication, programming said first NVM cell and erasing said second NVM cell;
   c) when said indication is a latch state reset indication, erasing said first NVM cell and programming said second NVM cell; and
   d) when said indication is a latch state read indication, biasing each of said gates to read said latch state on an output node.

26. The method of claim 25, further comprising generating said latch state read indication in response to chip power-up.

27. The method of claim 25, wherein said programming comprises using channel hot electron (CHE) injection.

28. The method of claim 25, wherein said erasing comprises using channel-induced hot hole (CHH) injection.

29. An electrically erasable programmable read-only memory (EEPROM) device, comprising:
   a) a controller configured to control programming, erasing, and reading of a memory portion; and
   b) said memory portion having a plurality of non-volatile latches, wherein each said non-volatile latch includes a first non-volatile memory (NVM) cell connected to a first supply, a first gate, and an output node, and wherein said first NVM cell is configured to be in a first state, and a second NVM cell connected to a second supply, a second gate, and said output node, wherein said second NVM cell is configured to be in a second state, wherein said first and second gates are independently controllable.

30. The EEPROM device of claim 29, further comprising an array of NVM cells.

31. The EEPROM device of claim 29, further comprising an array of static random-access memory (SRAM) cells.

32. The EEPROM device of claim 29, wherein said first state is ON, and said second state is OFF.

33. The EEPROM device of claim 29, wherein said first state is OFF, and said second state is ON.

34. The EEPROM device of claim 29, wherein said first and second states are ON.

35. The EEPROM device of claim 29, wherein said first and second states are OFF.

36. A method of operating a non-volatile latch, comprising the steps of:
   a) receiving an indication for accessing said non-volatile latch, said non-volatile latch including a first non-volatile memory (NVM) cell coupled in series with a second NVM cell, wherein said first and second NVM cells are independently controllable using separate gates;
   b) when said indication is a latch state set or reset indication, performing a non-selective operation on both said first and said second NVM cells, and performing a selective operation on either of said first or said second NVM cells; and
   c) when said indication is a latch state read indication, biasing each of said gates to read said latch state on an output node.

37. The method of claim 36, wherein said non-selective operation comprises programming.

38. The method of claim 37, wherein:
   a) when said indication is a latch state set indication, erasing said second NVM cell; and
   b) when said indication is a latch state reset indication, erasing said first NVM cell.

39. The method of claim 36, wherein said non-selective operation comprises erasing.

40. The method of claim 39, wherein:
   a) when said indication is a latch state set indication, programming said first NVM cell; and
   b) when said indication is a latch state reset indication, programming said second NVM cell.

* * * * *